(12) United States Patent
Hartzog et al.

(10) Patent No.: US 7,679,369 B2
(45) Date of Patent: Mar. 16, 2010

(54) SYSTEM AND METHOD TO MEASURE SERIES-CONNECTED CELL VOLTAGES USING A FLYING CAPACITOR

(75) Inventors: Chad Hartzog, Kokomo, IN (US); Ronald H. Jaeger, Indianapolis, IN (US)

(73) Assignee: EnerDel, Inc., Indianapolis, IN (US)

( * ) Notice: Subject to any disclaimer, the term of this patent is extended or adjusted under 35 U.S.C. 154(b) by 0 days.

(21) Appl. No.: 11/868,693

(22) Filed: Oct. 8, 2007

(65) Prior Publication Data

US 2008/0084217 A1    Apr. 10, 2008

Related U.S. Application Data

(60) Provisional application No. 60/828,464, filed on Oct. 6, 2006, provisional application No. 60/828,457, filed on Oct. 6, 2006, provisional application No. 60/828,471, filed on Oct. 6, 2006.

(51) Int. Cl.
    *G01N 27/416* (2006.01)
(52) U.S. Cl. .................. 324/426; 324/436; 320/118
(58) Field of Classification Search ............. 320/118, 320/119; 324/426, 436
    See application file for complete search history.

(56) References Cited

U.S. PATENT DOCUMENTS

| | | | |
|---|---|---|---|
| 5,498,950 A | | 3/1996 | Ouwerkerk |
| 5,661,393 A | * | 8/1997 | Sengupta .................... 320/146 |
| 5,748,134 A | | 5/1998 | Dent |
| 5,808,469 A | | 9/1998 | Kopera |
| 5,841,996 A | * | 11/1998 | Nolan et al. ................ 710/305 |
| 5,914,606 A | | 6/1999 | Becker-Irvin |
| 6,020,717 A | | 2/2000 | Kadouchi et al. |
| 6,104,164 A | | 8/2000 | Iino et al. |
| 6,157,165 A | | 12/2000 | Kinoshita et al. |
| 6,362,627 B1 | | 3/2002 | Shimamoto et al. |
| 6,570,387 B2 | | 5/2003 | Maki et al. |
| 6,639,408 B2 | * | 10/2003 | Yudahira et al. ............ 324/434 |
| 6,646,442 B2 | | 11/2003 | Katoh |
| 6,677,758 B2 | | 1/2004 | Maki et al. |
| 6,803,766 B2 | * | 10/2004 | Kobayashi et al. .......... 324/434 |
| 6,983,212 B2 | | 1/2006 | Burns |
| 7,071,698 B2 | | 7/2006 | Furukawa et al. |
| 7,078,908 B2 | | 7/2006 | Fujita et al. |
| 7,352,155 B2 | * | 4/2008 | Li et al. ...................... 320/118 |
| 2003/0052650 A1 | | 3/2003 | Gunji |
| 2005/0083015 A1 | | 4/2005 | Adachi |

(Continued)

OTHER PUBLICATIONS

PCT International Search Report, PCT/US07/21561, International Filing Date: Oct. 9, 2007.

*Primary Examiner*—Edward Tso
*Assistant Examiner*—Samuel Berhanu
(74) *Attorney, Agent, or Firm*—Ice Miller LLP

(57) ABSTRACT

A system and method for measuring voltage of individual cells connected in series includes a single flying capacitor. The capacitor stores the charge of one of the cells such that an analog-to-digital converter (ADC) connected to the capacitor may process an accurate representation of the voltage of the cell being measured. A plurality of switches electrically connects and disconnects the cells from the capacitor. A controller is in communication with the ADC and the switches for sequencing the switches and recording the voltage measurements of each cell. At least one precision voltage reference device is included to provide the ADC a reference voltage to provide self-calibration.

11 Claims, 4 Drawing Sheets

U.S. PATENT DOCUMENTS

2005/0189949 A1 9/2005 Shimizu et al.
2005/0206364 A1 9/2005 Ishikawa et al.
2005/0253556 A1* 11/2005 Kuiri .......................... 320/128
2006/0103351 A1 5/2006 Tanigawa et al.
2006/0132139 A1 6/2006 Ohta et al.

* cited by examiner

SYSTEM AND METHOD TO MEASURE SERIES-CONNECTED CELL VOLTAGES USING A FLYING CAPACITOR

CROSS REFERENCE TO RELATED APPLICATIONS

This application claims the benefit of U.S. Provisional Application No. 60/828,464 filed Oct. 6, 2006, U.S. Provisional Application No. 60/828,457 filed Oct. 6, 2006, and U.S. Provisional Application No. 60/828,471 filed Oct. 6, 2006, all of which are incorporated by reference.

BACKGROUND OF THE INVENTION

1. Field of the Invention

The subject invention relates to a system and method for determining a voltage in each cell of a plurality of battery cells connected in series.

2. Description of the Related Art

Electric vehicles and hybrid-electric vehicles typically utilize numerous cells (i.e., batteries) for powering electric drive motors and other electric equipment. These cells are often connected together in a series relationship, as is well known to those skilled in the art, to provide higher voltages.

Due to variations between individual cells, such series-connected cells require periodic balancing, i.e., charge equalization, to maintain a steady voltage and prevent premature failure. One difficulty in cell balancing is determining which cell or cells may need to individually charged or replaced. Therefore, it is necessary to provide a system to determine the voltage in each cell.

Numerous systems and techniques have been developed to address this necessity. One such system is disclosed in U.S. Pat. No. 5,914,606 (the '606 patent) to Becker-Irvin. The system disclosed in the '606 patent teaches each individual cell being directly connected to an amplifier through a bank of switches. A controller is also connected to the amplifier to measure the voltage of the selected cell. Unfortunately, the system of the '606 patent does not provide any isolation between the cells and the controller, resulting in a fluctuating voltage, especially when the cells are in use. Furthermore, the system of the '606 patent would require high precision resistor dividers to divide the voltage down to an acceptable level for measurement.

Other systems utilize one or more capacitors between the cells and the amplifier such that a more stable and accurate voltage may be measured. For instance, U.S. Pat. No. 6,362,627 (the '627 patent) to Shimamoto et al. discloses a system with a plurality of cell switches connected to various cells, a capacitor connected to the cell switches, and an amplifier connected to the capacitor. The '627 patent uses a secondary polarity correction, which would add to measurement error.

Japanese Patent Abstract Publication No. 2003240806 (the '806 publication) to Yazaki Corporation discloses a system for measuring voltage of individual cells in a plurality of cells connected in series. The system includes a plurality of cell switches electrically connected to the plurality of cells with one switch connected on each side of each cell. A first bus is electrically connected to the second side of every other cell switch and a second bus is electrically connected to the second side of each cell switch not connected to the first bus. A capacitor is electrically connected between the busses. Four bus switches are electrically connected to the capacitor and the busses: one pair of bus switches allow connection between either side of the capacitor and an amplifier, while another pair of bus switches allows connection between either side of the capacitor and ground. The system of the '806 publication may not accommodate an implementation with MOSFET-type transistors as switches, since some current must be drawn from the system in order to turn on the MOSFETs.

Despite the various systems described above and existing elsewhere in the prior art, there remains an opportunity for a system for measuring voltage of individual cells connected in series having improved accuracy, higher measurement speed, and lower implementation costs.

SUMMARY OF THE INVENTION AND ADVANTAGES

The subject invention provides a system for measuring voltage of individual cells in a plurality of cells connected in series. The system includes a capacitor for storing a charge of at least one of the cells. The capacitor includes a pair of terminals. At least one switch is electrically connected to the capacitor for selectively connecting at least one of the cells to the capacitor. The system also includes an amplifier for amplifying the charge stored on the capacitor. The amplifier includes a pair of inputs electrically connected to the terminals of the capacitor and an output. An analog-to-digital converter (ADC) is electrically connectable to the output of the amplifier for converting an amplified analog voltage supplied by the amplifier into digital voltage data. The system also includes at least one precision voltage reference (PVR) device for providing a known reference voltage.

The subject invention also provides a method of measuring voltage of individual cells in a plurality of cells connected in series. The method includes the steps of electrically connecting one of the cells to a capacitor and charging the capacitor for a predetermined charge time. The voltage of the capacitor is measured in response to an elapse of the predetermined charge time to generate a charged voltage reading. The method also includes the step of discharging the capacitor for a predetermined discharge time. The voltage of the capacitor is then measured in response to an elapse of the predetermined discharge time to generate a discharge voltage reading. The discharge voltage reading and a predetermined voltage level are then compared. The method further includes the step of signaling a malfunction if the discharged voltage reading of the capacitor is greater than the predetermined voltage level.

The subject invention further provides a method of measuring voltage of individual cells in a plurality of cells connected in series. The method utilizes a system including a capacitor, an analog-to-digital converter (ADC), and a controller. The method includes the steps of electrically connecting one of the cells to the capacitor and charging the capacitor for a predetermined charge time. During the predetermined charge time, the controller performs ancillary tasks. The method also includes the step of converting the analog voltage from the capacitor to a digital voltage signal corresponding to the voltage of the capacitor using the ADC in response to an elapse of the predetermined charge time. The digital voltage signal is then read by the controller.

The subject invention provides numerous advantages over the prior art. First, the PVR device provides the ability to calibrate the system to ensure the accuracy of the measured voltage. Second, the subject invention is able to self-detect errors and malfunctions in the system. Lastly, by the controller performing its ancillary tasks during the capacitor charging time, the overall efficiency of the system is improved.

BRIEF DESCRIPTION OF THE DRAWINGS

Other advantages of the present invention will be readily appreciated, as the same becomes better understood by reference to the following detailed description when considered in connection with the accompanying drawings wherein.

DETAILED DESCRIPTION OF THE INVENTION

Referring to the Figures, wherein like numerals indicate corresponding parts throughout the several views, a system 10 and method 100 for measuring voltage of individual cells 12 in a plurality of cells connected in series is shown. Those skilled in the art realize that a "cell" is commonly referred to as a "battery". However, for purposes of consistency, the term cell 12 shall be used throughout and should not be regarded as limiting in any way.

Figure 1:
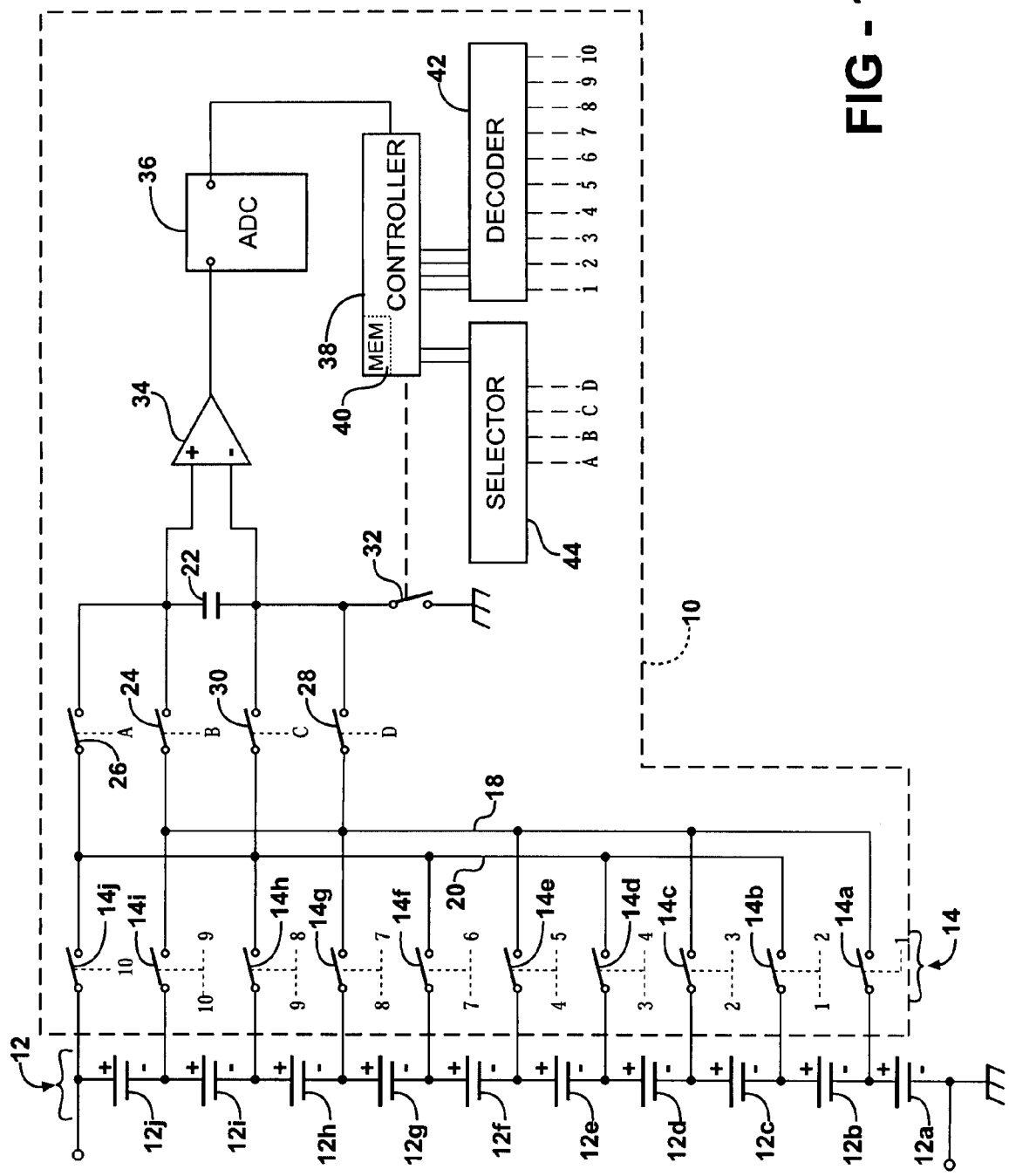
FIG. 1 is a block electrical schematic diagram of a first embodiment of a system of the present invention showing a plurality of cells and the system for measuring a voltage of each individual cell including a flying capacitor and an analog-to-digital converter (ADC)

FIG. 1 shows a first embodiment of the system 10 of the present invention. Ten cells 12 are connected in series for providing power to an electrical device, such as, but not limited to, an electric vehicle (EV) or hybrid electric vehicle (HEV). Each cell is preferably a lithium cell with a charged voltage of about 4 volts (V), therefore providing a total voltage of about 40 V. Of course, any number, type, or capacity of cells 12 may be utilized with the subject invention, and the use of ten, lithium, 4 V cells 12 in the preferred embodiment should not be regarded as limiting. Furthermore, the plurality of cells 12 may be used in other applications outside of a vehicle. For purposes of descriptive clarity, the cells 12 are sequentially on the various Figures from the first cell 12A through a tenth cell 12J.

Each cell 12 includes a positive side (i.e., cathode) and a negative side (i.e., anode) as is known to those skilled in the art. The plurality of cells 12 are electrically connected together in series. That is, a positive side of the first cell 12A is electrically connected to a negative side of a second cell 12B, a positive side of the second cell 12B is electrically connected to a negative side of a third cell 12C, and so on. Typically, where the cells 12 are disposed in a vehicle, the negative side of the first cell 12A is electrically connected to a chassis ground, i.e., the metallic frame of the vehicle. However, there may be situations where the negative side of the first cell 12A is electrically isolated from the chassis ground.

Those skilled in the art appreciate that each cell 12 may actually be several physical cells 12 connected in parallel and operating at the same voltage level for increasing the current capacity of the entire plurality of cells 12 connected in series. Moreover, each cell 12 may actually be several physical cells connected in series.

In the illustrated embodiments, the system 10 includes a plurality of cell switches 14. Each cell switch 14 has a first side (not numbered) and a second side (not numbered), such that electrons may flow between the sides when the cell switch 14 is activated. Conversely, electrons are generally prevented from flowing between the sides when the cell switch 14 is deactivated.

Preferably, the cell switches 14 are implemented utilizing transistors, such that the electrical switching performed by the cell switches 14 can be done without moving parts (i.e., a "solid state" implementation). Most preferably, the cell switches 14 are implemented as a pair of metal oxide silicon field-effect transistors (MOSFETs). Each MOSFET in the pair are preferably a BSS84 P-channel type, which are available from numerous electronics manufacturers. The sources of each MOSFET of the pair are electrically connected together and the gates of each MOSFET are electrically connected together. The drain of one MOSFET acts as the first side of the cell switch 14 and the drain of the other MOSFET acts as the second side of the cell switch 14. The use of MOSFETs, instead of mechanical or relay type switches, greatly reduces implementation cost of the system 10 as well as increases the cycle speed of cell 12 measurement.

However, those skilled in the art realize that each switch could alternatively be implemented with a single MOSFET, a different type of transistor(s), different types of field-effect transistors, a relay, or other suitable switching device. Furthermore, operation of the cell switches 14 (and other switches) herein may be referred to within this application as "opening", "opened", "closed", or "closing", etc., such as is the convention for mechanical type switches. However, this is done for convenience purposes only, and should not be read as limited the cell switches 14 (and other switches) to mechanical type switches.

Preferably, the number of cell switches 14 should equal the number of cells 12 to be measured. Therefore, in the illustrated embodiments, where ten cells 12 are connected in series, ten cell switches 14 are utilized. For purposes of descriptive clarity, the ten cell switches 14 are labeled sequentially from a first cell switch 14A through a tenth cell switch 14I. The first side of each cell switch 14 is electrically connectable to a positive terminal of one of the cells 12.

Also for purposes of descriptive clarity, the first side of the first cell switch 14A is electrically connected to the positive side of the first cell 12A, the second side of the second cell switch 14B is electrically connected to the positive side of the second cell 12B, and so on. Since the cells 12 are electrically connected in series, the first side of the first cell switch 14A is electrically connected to both the positive side of the first cell 12A and the negative side of the second cell 12B. The same reasoning holds true for the other cell switches 14.

The system 10 may also include a plurality of cell switch operation circuits (not shown). Each cell switch operation circuit is electrically connected to at least one cell switch 14 for activating the at least one cell switch 14. In the illustrated embodiments, each cell switch operation circuit may operate a pair of cell switches 14.

Referring again to FIG. 1, the system 10 of the illustrated embodiments also includes a first bus 18 and a second bus 20. The first bus 18 is formed by electrical connection of every other cell switch 14, i.e., alternating cell switches 14. The second bus 20 is formed by electrical connection of every cell switch 14 not connected to the first bus 18. In the preferred embodiment, as shown in FIG. 1, the first bus 18 electrically connects the second side of the first, third, fifth, seventh, and ninth cell switches 14A, 14C, 14E, 14G, 14I. The second bus 20 electrically connects the second side of the second, fourth, sixth, eighth, and tenth cell switches 14B, 14D, 14F, 14H, 14J are electrically connected together. In the first alternative embodiment, shown in FIG. 2, the additional cell switch 16 is electrically connected to the second bus 20.

The system 10 includes a capacitor 22 for holding a charge corresponding to a voltage of one of the cells 12. The capacitor 22 includes a pair of terminals. For convenience, these terminals are referred to hereafter as a positive terminal and a negative terminal. In the illustrated embodiments, the capacitor 22 has a capacitance of 1 μF (micro Farad). One acceptable capacitor 22 is the ECWU1105KCV, manufactured by Panasonic, and rated for 100 volts DC with a capacitance tolerance of ±10%. Of course, other capacitors 22, with varying capacitances and other physical and electrical characteristics, may also be acceptable. The capacitor 22 may be charged by each of the plurality of cells, as described in greater detail below. Therefore, the capacitor 22 is referred to by those skilled in the art as a "flying capacitor".

The system 10 of the illustrated embodiments further includes four bus switches 24, 26, 28, 30 for coordinating charging and isolating the capacitor 22. As with the cell switches 14, each of these bus switches 24, 26, 28, 30 has a first side and a second side. Furthermore, each bus switch 24, 26, 28, 30 is preferably implemented as a pair of MOSFETs, configured in the same fashion as the cell switches 14 described above.

The plurality of bus switches 24, 26, 28, 30 includes a first bus positive switch 24, a second bus positive switch 26, a first bus negative switch 28, and a second bus negative switch 30. The first sides of the first bus positive switch 24 and the first bus negative switch 28 are electrically connected to the first bus 18. The first sides of the second bus positive switch 26 and the second bus negative switch 30 are electrically connected to the second bus 20. The second sides of the first bus positive switch 24 and the second positive switch are electrically connected to the positive terminal of the capacitor 22. The second sides of the first bus negative switch 28 and the second bus negative switch 30 are electrically connected to the negative terminal of the capacitor 22.

The system 10 may also include a ground switch 32. One side of the ground switch 32 is electrically connected to the negative terminal of the capacitor 22 and the other side is electrically connected to ground. Where the system 10 is implemented in a vehicle, the ground is typically the chassis ground. In the preferred embodiment, the negative ground switch 32 is implemented as a BSS145-type MOSFET; however, other suitable MOSFETs may be used. The source of the MOSFET is electrically connected to ground and the drain is electrically connected to the negative terminal of the capacitor 22.

The system 10 preferably includes an amplifier 34 for amplifying the charge stored on the capacitor. In the illustrated embodiments, the amplifier 34 is an operational amplifier (op-amp) 34. For purposes of convenience, the term op-amp 34 will be used hereafter in place of the term amplifier 34; however, this should not be read as limiting in any way. The op-amp 34 includes two inputs (typically referred to as a non-inverting input an inverting input) and an output. In the illustrated embodiments, the op-amp 34 provides an amplified gain from each input to output of 1, otherwise referred to as a unity gain amplifier. One suitable op-amp 34 is an LT1636, available from Linear Technology Corporation of Milpitas, Calif. However, other suitable op-amps 34 or other types of amplifiers 34 may also be implemented.

In the illustrated embodiments, the non-inverting input of the op-amp 34 is electrically connected to the positive terminal of the capacitor 12 and the inverting input of the op-amp 34 is electrically connected to the negative terminal of the capacitor 22. The op-amp 34 amplifies the voltage of the capacitor 22 and produces an amplified voltage signal. The amplified voltage signal is available at the output of the op-amp 34 and proportionally corresponds to the voltage of the capacitor 22, and also, the cell 12 that charged the capacitor 22.

The system 10 also includes an analog-to-digital converter (ADC) 36 electrically connectable to the output of the op-amp 34 for converting an analog signal supplied by the op-amp 34 into digital data. In the first and third embodiments, the output of the op-amp 34 is directly connected to the ADC 36. However, in the second embodiment, a multiplexer 46 is utilized as described in further detail below.

In the illustrated embodiments, the ADC 36 includes an input for receiving the analog signal and an output for producing a digital signal carrying the digital data. One suitable ADC 36 is an ADS7829IDRBR manufactured by Texas Instruments of Dallas, Tex. The digital signal of this ADC 36 has a 12-bit resolution and is presented serially at the output. The input of the ADC 36 is electrically connected to the output of the op-amp 34. The ADC 36 receives the amplified voltage signal at the input and produces the digital signal corresponding to the amplified voltage signal. Therefore, the digital data carried by the digital signal proportionally corresponds to the voltage of the capacitor 22 and the cell 12 that charged the capacitor 22. This digital data may be referred to herein as the digital voltage data.

The system 10 further includes a controller 38 for controlling operations of the various components of the system 10. The controller 38 may be a microprocessor, microcontroller, computer, application specific integrated circuit (ASIC), or other similar device known to those skilled in the art. In the illustrated embodiments, the controller 38 is a model 68HC908GR32A microcontroller, manufactured by Freescale Semiconductor, headquartered in Austin, Tex. Of course, other controllers would also be suitable.

The controller 38 is in communication with the ADC 36 for receiving the digital data from the ADC 36. Specifically, in the illustrated embodiments, the controller 38 includes a plurality of inputs and outputs. The plurality of inputs including a measurement input for receiving a digital signal. The measurement input is electrically connected to the output of the ADC 36, such that the digital data corresponding to the voltage of the capacitor 22 (and each cell 12) is received by the controller 38. As is well known to those skilled in the art, many controllers have one or more internal ADCs. Therefore, in other embodiments (not shown) the ADC 36 may be integrated within the controller 38.

A memory 40 is in communication with the controller 38 for storing data. This data includes, but is not limited to, the digital data corresponding to the voltage of the each cell 12, i.e., the digital voltage data. The memory 40 may be random access memory (RAM), flash memory, a hard disk, a floppy disk, a compact disk, or any other memory device know by those skilled in the art. Furthermore, the memory 40 may be internal to the controller 38, as is the case with the illustrated embodiments.

In the illustrated embodiments, the controller 38 is in communication with the switches 14, 24, 26, 28, 30, 32 for controlling the operation of the switches 14, 24, 26, 28, 30, 32. With respect to the cell switches 14, four outputs of the controller 38 are preferably electrically connected to a decoder 42. The decoder 42 is preferably a BCD (binary coded digit) to decimal decoder 42, such as a 74HC4028. The preferred decoder 42 includes four inputs electrically connected to the controller 38 and ten outputs (i.e., a first decoder output through a tenth decoder output). Only one output of the decoder 42 is activated based on the BCD provided by the controller 38 to the inputs of the decoder 42. Each of the ten outputs is electrically connected to one of the cell switch operation circuits to operate at least one cell switch 14. In the illustrated embodiments, the first decoder output operates the first cell switch 14A, a second decoder output operates the first and second cell switches 24, a third decoder output operates the second and third cell switches 24, and so on through the tenth decoder output, which operates the ninth and tenth cell switches 24.

In the illustrated embodiments, at least one output of the controller 38 is utilized to control the operation of the bus switches 24, 26, 28, 30. A selector 44 is implemented between the controller 38 and the bus switches 24, 26, 28, 30 to control the bus switches 24, 26, 28, 30. Furthermore, at least one output of the controller 38 is electrically connected to the ground switch 32 to control the operation of the ground switch 32.

The various components of the system 10 may be mounted on a printed circuit board (PCB), as is well known to those skilled in the art. The PCB is printed, on one or both sides, with a conductive material through a mask. The conductive material electrically connects the various components, such that extensive wiring between the components is not needed. Of course, various other electrical and electronic devices may be utilized in an implementation of the system 10, other than the devices described above. As is well known to those skilled in the art, these devices may include, but are not limited to, resistors, diodes, bipolar-junction transistors (BJTs), and capacitors.

The functionality, advantages, accuracy, and efficiency of the present invention may be better understood when examining the method 100 of determining the voltage of the cells 12. For convenience, the method 100 is described hereafter in terms of the various components of the system 10. However, the method 100, as described and claimed herein, may be practiced in situations outside of the described system 10.

The method 100 may include the step 102 of selecting one of the cells 12 for measurement. In the illustrated embodiments of the system 10, the controller 38, by operation of software, selects which cell 12 is to be measured. Typically, the software in the controller 38 will simply sequence through the cells 12 such that the voltage of each cell 12 is measured in turn. However, in certain situations, the controller 38 may deviate from such sequential operation to focus on a particular cell 12.

The method 100 continues with the step 104 of electrically connecting one of the cells 12 to the capacitor 22. Preferably, the cell 12 connected to the capacitor 22 is the selected cell 12 selected in step 102. In the illustrated embodiments of the system 10, the controller 38 operates the various switches 14, 24, 26, 28, 30, 32, based on the selected cell 12, such that the positive terminal of the capacitor 22 is electrically connected to the positive side of the selected cell 12 and the negative terminal of the capacitor 22 is electrically connected to the negative side of the selected cell 12. The controller 38 utilizes the decoder 42 to operate the cell switch 14 or cell switches 14 corresponding to the selected cell 12. The controller utilizes the selector 44 to operate the appropriate bus switches 24, 26, 28, 30.

As an example, when determining a voltage of the first cell 12A, the capacitor 22 must be charged to the voltage of the first cell 12A. Therefore, the first cell switch 14A is closed, while the other cell switches 14B-14J are opened. Since, in the preferred embodiment, the negative side of the first cell 12A is grounded, the controller closes the ground switch 32. The first bus positive switch 24 and the second bus negative switch 30 are closed while the second bus positive switch 26 and the first bus negative switch 28 are open. Thus, the capacitor 22 will charge to the voltage level of the first cell 12A.

As further examples, when the second cell 12B is selected, the first and second cell switches 14A, 14B are closed, while the other cell switches 14C-14J are opened. The second bus positive switch 26 and the first bus negative switch 28 are closed while the first bus positive switch 24, the second bus negative switch 30, and the ground switch 32 are open. Thus, the capacitor 22 will charge to the voltage level of the second cell 12B. When the third cell 12C is selected, the second and third cell switches 14B, 14C are closed, while the other cell switches 14A, 14D-14J are opened. The first bus positive switch 24 and the second bus negative switch 30 are closed while the second bus positive switch 26, the first bus negative switch 28, and the ground switch 32 are open. Thus, the capacitor 22 will charge to the voltage level of the third cell 12C. Obviously, one skilled in the art may determine the appropriate switches 14 to open and close for each other cell 12 using a similar methodology.

The method 100 continues with the step 106 of charging the capacitor for a predetermined charge time such that the voltage level of the capacitor 22 substantially matches the voltage level of the cell 12 that is being measured. Accordingly, the predetermined charge time is based on the electrical characteristics of the cell 12 and the capacitor 22 and is preferably tracked by the controller 38.

During the predetermined charge time, the controller 38 is not burdened with its primary tasks, which include, but are not limited to controlling the various switches 14, 24, 26, 28, 30, 32 and reading the signals from the ADC 36. Therefore, the controller 38 is free to perform ancillary (i.e., secondary) tasks in step 107 of the method 100. These ancillary, but nevertheless necessary, tasks may include system 10 diagnostics, such as, but not limited to, checking controller 38 inputs/outputs to verify that the signals are in the proper range. If signals are not in the proper range, the controller 38 may record a fault, shut down the system 10, etc. The ancillary tasks may also include controller 38 communications. For example, the controller 38 may communicate (1) with other controllers or microprocessors in the same system 10, (2) other controllers in different cell measurement systems in the same vehicle, (3) with other systems or networks in the vehicle (e.g., a vehicle communications bus), and/or (4) with other systems or networks outside the vehicle (e.g., the Internet). Those skilled in the art will realize other ancillary tasks to be performed by the controller 38 during the capacitor charge time.

By confining these ancillary tasks to the charging time period, overall efficiency of the system 10 is achieved. Specifically, the system 10 and the controller 38 are able to achieve faster and more frequent cell 12 voltage measurements. Frequent cell 12 voltage measurements are critical in dynamic load applications such as hybrid or electric vehicles.

Preferably, in response to the elapsing of the predetermined charge time, the method 100 continues with the step 108 of electrically disconnecting the cell 12 from the capacitor 22. Specifically, in the illustrated embodiments of the system 10, the switches 14, 24, 26, 28, 30, 32 are operated such that the capacitor 22 is electrically disconnected from the cells 12 and electrically connected to the input of the ADC 36. Preferably, all of the cell switches 12 and the bus switches 24, 26, 28, 30 are opened and the ground switch 32 is closed such that the negative terminal of the capacitor 22 and the inverting input of the op-amp 24 are both grounded.

Also in response to the elapse of the predetermined charge time, the method 100 continues with the step 110 of measuring the voltage of the capacitor 22. In the illustrated embodiment, this step 110 of measuring can be broken down into three sub steps. First, the voltage of the capacitor 22 is amplified to generate an amplified analog voltage signal. As stated above, the amplification of the voltage of the capacitor 22 may be by a factor of 1, so no increase in voltage occurs. Next, the ADC 36 receives the amplified analog voltage signal from the op-amp 34. Accordingly, the amplified analog voltage signal is converted to a digital voltage signal. As stated above, the ADC 36 is electrically connected to, or integrated with, the controller 38. Therefore, the digital voltage signal is communicated to the controller 38. The digital voltage signal encodes digital data that corresponds to the voltage of the capacitor 22, and thus the voltage of the selected cell 12. In response to the controller 38 reading the voltage of the capacitor 22, the voltage, which corresponds to the voltage of the cell 22 being measured, is stored in the memory 40.

After the voltage of the capacitor 22 is read and stored in the memory 40, the method 100 preferably continues with the step 112 of discharging the capacitor 22 for a predetermined discharge time. In the system 10 of the illustrated embodiments, the capacitor 22 is discharged by operating the bus switches 24, 26, 28, 30 and the ground switch 32 such that positive and negative terminals of the capacitor 22 are electrically connected to ground. Specifically, all four bus switches 24, 26, 28, 30 and the negative ground switch 32 are closed and all of the cell switches 14 are opened.

Discharging of the capacitor 12 allows for detection of a disconnected cell 12 or an open-circuit within the system 10 in subsequent cell voltage measurements. Furthermore, this operation allows the system to discharge any capacitance that results between the busses 18, 20 as well as discharging the op-amp 34. It is important to note that the illustrated system 10 allows for grounding/discharging of both the capacitor 22 and the op-amp 34 simultaneously at the same chassis ground connection. Therefore, this discharging is done in a uniform matter. With this uniform discharging and proper layout of the circuit on the PCB, a more accurate reading of the next measured cell 12 may be achieved.

Preferably, the method 100 includes the step 114 of measuring the voltage of the capacitor 22 in response to an elapse of the predetermined discharge time to generate a discharge voltage reading. Generation of the discharge voltage reading is similar to the generation of the charged voltage reading described above. Therefore, the controller 38 has access to the discharge voltage reading corresponding to the voltage of the capacitor 22 after discharge.

The method 100 also preferably includes the step 115 of comparing the discharge voltage reading to a predetermined voltage level. Ideally, after discharge, the discharge voltage reading of the capacitor 22 should be around 0 V. Therefore, as an example, the predetermined voltage level may be 0.3 V. The actual predetermined voltage level is determined based on the specific electrical characteristics of the system 10, including the electrical characteristics of the capacitor 22, the ADC 36, and other components.

By measuring and comparing the discharge voltage reading, the method 100 serves to verify that the capacitor 22 is fully discharged before proceeding. These steps allow the system 10 to confirm that the capacitor 22 is ready to be charged by the next cell 12. The benefits of discharging the capacitor 22 before recharging are set forth above. Furthermore, this step 115 also helps to confirm that the switches 14, 24, 26, 28, 30, 32 of the system 10 are working properly.

The method 100 preferably continues with the step 116 of signaling a malfunction if the discharged voltage reading of the capacitor 22 is greater than the predetermined voltage level. This step 116 of signaling a malfunction may include recording the malfunction to the memory 40 and/or alerting a user to the malfunction. Furthermore, the step 116 of signaling the malfunction may result in a shutdown of the system 20, automatic disconnection of the cells 12, or other consequences based on the usage of the cells 12.

Alternatively, instead of signaling the malfunction when the voltage reading of the capacitor 22 is greater than the predetermined voltage level, several of the steps may be repeated. For instance, the capacitor may be re-discharged and have its voltage re-measured. If the voltage reading of the capacitor 22 is still greater than the predetermined voltage level, after one or more iterations, then the method 100 could proceed to the signaling step 116.

The system 10 may also include one or more resistive balancing circuits (not shown) for balancing the cells 12, i.e., adjusting the voltage of each cell 12 so that the voltage of each cell 12 is substantially similar. This adjustment of the cells 12 is preferably based on the voltage readings obtained for each cell 12 as described above.

Figure 3:
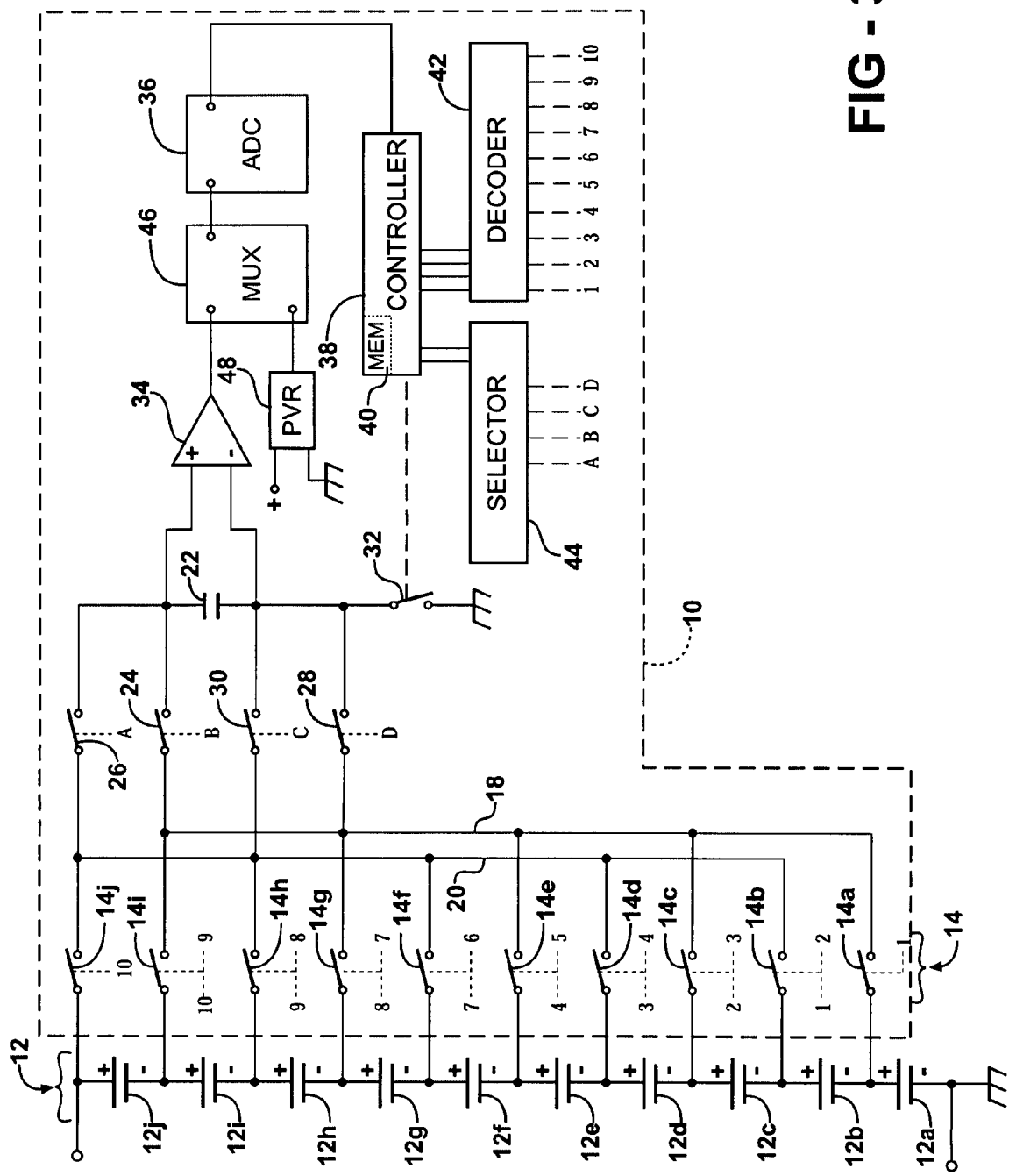
FIG. 3 is a block electrical schematic diagram of a second embodiment of the system showing a precision voltage reference (PVR) electrically connectable to the ADC.
Figure 4:
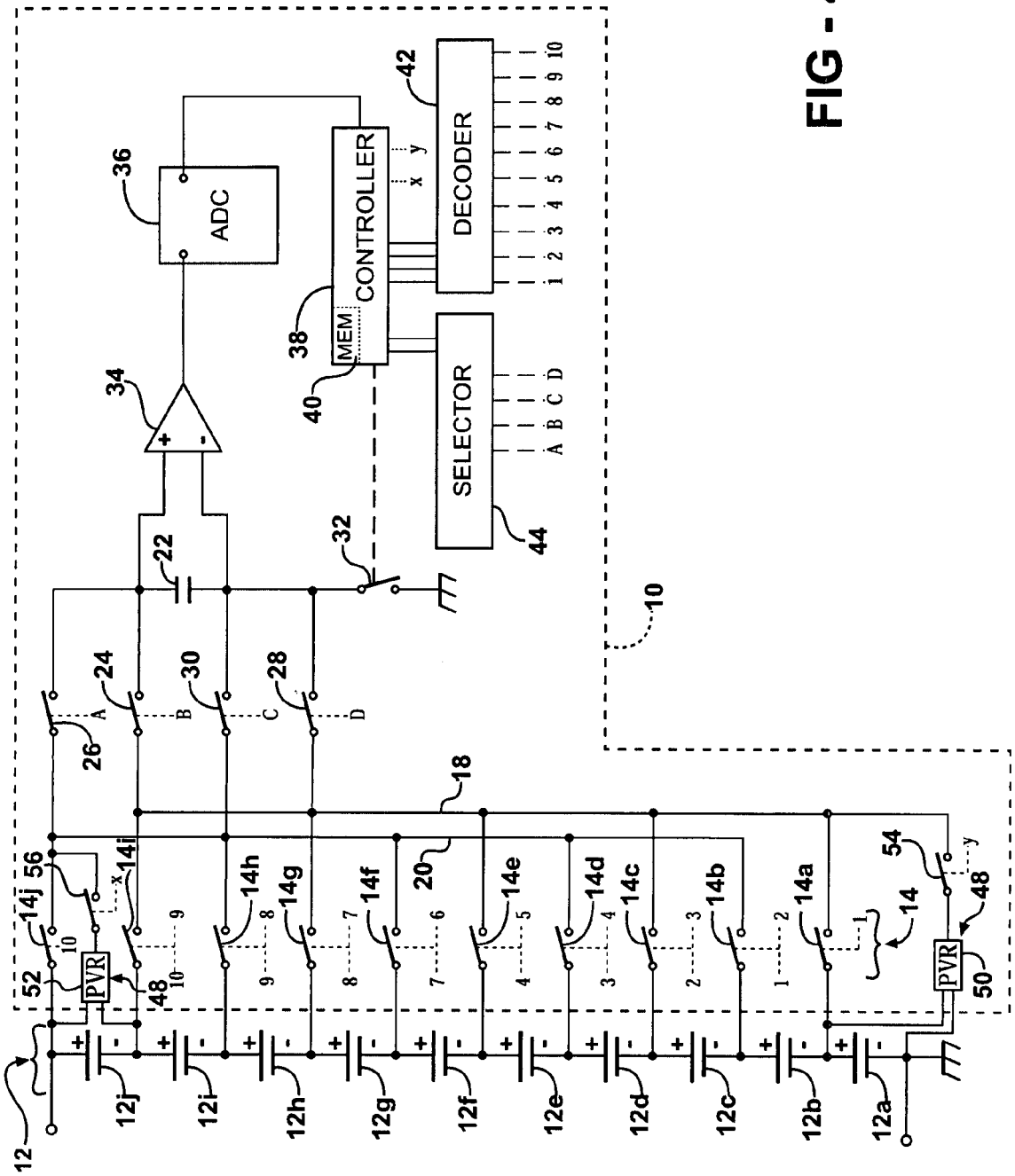
FIG. 4 is a block electrical diagram of a third embodiment of the system showing a pair of PVRs electrically connectable to the flying capacitor.

In the second and third embodiments of the invention, as shown in FIGS. 3 and 4, the system 10 includes at least one precision voltage reference (PVR) device 48. The at least one PVR device 48 provides a known reference voltage which allows for calibration of the system 10 as well as detection of problems with the system 10. The calibration is preferably performed by the controller 38 which makes adjustments to the digital voltage data read from the ADC 36 such that the digital voltage data more properly reflects the actual voltage sent to the ADC 36. The PVR device 48 includes an output (not numbered) which provides the known reference voltage.

Figure 2:
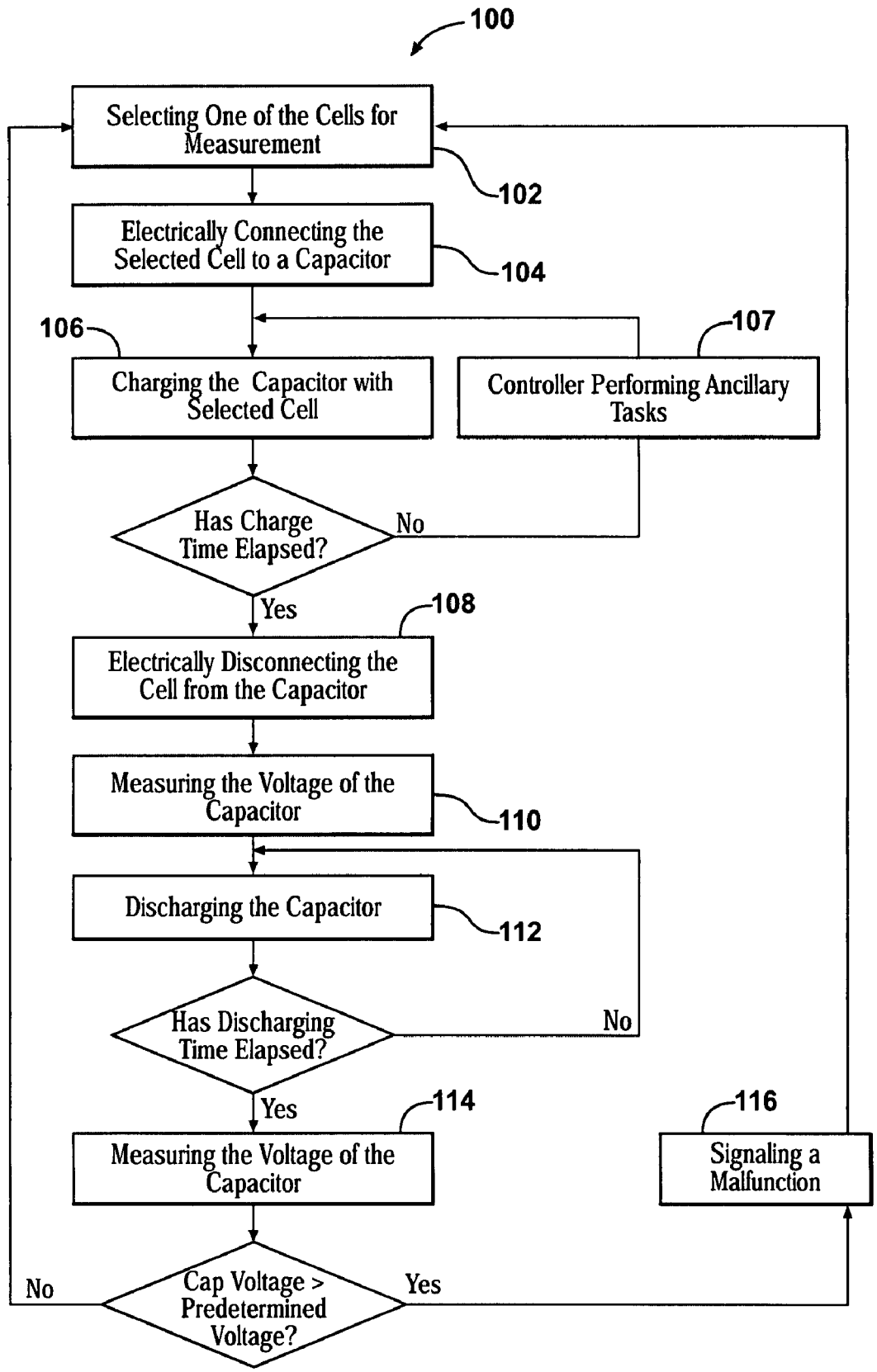
FIG. 2 is a flowchart diagram of a method of measuring voltage of one of the cells.

In the second embodiment, the at least one PVR device 48 is electrically connectable to the ADC 36 such that the reference voltage may be provided to the ADC 36. As illustrated in FIG. 2, the system 10 of the second embodiment utilizes the multiplexer 46 to electrically connect a single PVR device 48 to the ADC 36. The multiplexer 46 preferably includes a plurality of analog inputs, an analog output, and at least one selecting input. The multiplexer 46 receives a plurality of signals on the analog inputs and routes one of those signals to the analog output based on the state of the at least one selecting input. One of the analog inputs of the multiplexer 46 is electrically connected to the op-amp 34 and another of the analog inputs is electrically connected to the output of the PVR device 48.

The analog output of the multiplexer 46 is electrically connected to the ADC 36. Accordingly, either the amplified voltage signal from the op-amp 46 or the reference voltage signal from the PVR device 48 may be routed to the ADC 36. The at least one selecting input is electrically connected to the controller 38 such that the controller 38 controls which of the voltage signals is routed to the ADC 36.

In the third embodiment, the at least one PVR device 48 is electrically connectable to the capacitor 22 such that the known reference voltage is provided to the capacitor 22. Specifically, the at least one PVR device 48 is implemented as a first PVR device 50 and a second PVR device 52. The output of the first PVR device 50 is electrically connected to a first PVR switch 54 and the output of the second PVR device 52 is electrically connected to a second PVR switch 56. The inputs of the PVR devices 50, 52 are each electrically connected to one of the cells 12. Specifically, the first PVR device 50 is electrically connected to the first cell 12A and the second PVR device 52 is electrically connected to the tenth cell 12J. Those skilled in the art will realize other techniques for supplying power to the inputs of the PVR devices 50, 52 including connecting to other cells 12.

The PVR switches 54, 56 are also electrically connected to one or more of the cell switches 14 and actuated in coordination with the cell switch 14 such that the PVR devices 50, 52 may provide the voltage to one of the busses 18, 20. Specifically, the cell switches 14 are open while at least one of the PVR devices 50, 52 are closed such that the PVR devices 50, 52 are providing the voltage to the busses 18, 20 and not the cells 12. One of the PVR devices 50, 52 may then provide their reference voltages to the op-amp 34 and the ADC 36 based on operation of the bus switches 24, 26, 30, 28. This allows the controller 38 to compensate for various losses that occur in the system 10 as well as the parasitic capacitance due to the busses 18, 20 and/or other components.

The present invention has been described herein in an illustrative manner, and it is to be understood that the terminology which has been used is intended to be in the nature of words of description rather than of limitation. Obviously, many modifications and variations of the invention are possible in light of the above teachings. The invention may be practiced otherwise than as specifically described within the scope of the appended claims.

What is claimed is:

1. A system for measuring voltage of individual cells in a plurality of cells connected in series, said system comprising:
    a capacitor for storing a charge of at least one of the cells wherein said capacitor includes a pair of terminals;
    at least one switch electrically connected to said capacitor for selectively connecting at least one of the cells to said capacitor;
    a plurality of cell switches for electrical connection to the plurality of cells wherein each cell switch includes a first side and a second side with said first side of each cell switch electrically connectable to a positive terminal of one of the cells;
    a first bus electrically connected to said second side of every other cell switch;
    a second bus electrically connected to said second side of each cell switch not connected to said first bus;
    an amplifier for amplifying the charge stored on said capacitor wherein said amplifier includes a pair of inputs electrically connected to said terminals of said capacitor and an output;
    an analog-to-digital converter (ADC) electrically connectable to said output of said amplifier for converting an amplified analog voltage supplied by said amplifier into digital voltage data; and
    at least one precision voltage reference (PVR) device for providing a known reference voltage wherein said at least one PVR device is electrically connectable to said capacitor such that the known reference voltage is provided to said capacitor wherein said at least one PVR device is further defined as a first PVR device and a second PVR device and wherein said first PVR device is electrically connectable to said first bus and said second PVR device is electrically connectable to said second bus.

2. A system as set forth in claim 1 further comprising a controller in communication with said ADC for receiving the digital data from said ADC.

3. A system as set forth in claim 2 further comprising a first PVR switch controlled by said controller and electrically connected to said first PVR device to electrically connect said first PVR device to said first bus.

4. A system as set forth in claim 3 further comprising a second PVR switch controlled by said controller and electrically connected to said second PVR device to electrically connect said second PVR device to said second bus.

5. A method of measuring voltage of individual cells in a plurality of cells connected in series, said method comprising:
    electrically connecting one of the cells to a capacitor;
    charging the capacitor for a predetermined charge time;
    measuring the voltage of the capacitor in response to an elapse of the predetermined charge time to generate a charged voltage reading;
    discharging the capacitor for a predetermined discharge time;
    measuring the voltage of the capacitor in response to an elapse of the predetermined discharge time to generate a discharge voltage reading;
    comparing the discharge voltage reading to a predetermined voltage level; and
    signaling a malfunction if the discharged voltage reading of the capacitor is greater than the predetermined voltage level.

6. A method as set forth in claim 5 wherein said step of signaling the malfunction is further defined as recording the malfunction to a memory.

7. A method as set forth in claim 5 wherein said step of signaling the malfunction is further defined as alerting a user of the malfunction.

8. A method as set forth in claim 5 further comprising the step of electrically disconnecting the cell from the capacitor in response to the elapse of the predetermined charge time.

9. A method as set forth in claim 5 wherein the capacitor includes a pair of terminals and wherein said step of discharging the capacitor is further defined as electrically connecting the terminals of the capacitor to a ground.

10. A method as set forth in claim 5 wherein said step of measuring the voltage of the capacitor is further defined as the steps of:
    amplifying the voltage of the capacitor to generate an amplified analog voltage signal;
    converting the amplified analog voltage signal to a digital voltage signal; and
    reading the digital voltage signal with a controller.

11. A method of measuring voltage of individual cells in a plurality of cells connected in series utilizing a system including a capacitor, an analog-to-digital converter (ADC), and a controller, said method comprising: electrically connecting one of the cells to the capacitor; charging the capacitor for a predetermined charge time; the controller performing ancillary tasks during the predetermined charge time; converting the analog voltage from the capacitor to a digital voltage signal corresponding to the voltage of the capacitor using the ADC in response to an elapse of the predetermined charge time; and reading the digital voltage signal by the controller; wherein said step of the controller performing ancillary tasks during the predetermined charge time is further defined as the controller communicating via a network during the predetermined charge time; wherein the controller communicating via a network is done exclusively during the predetermined charge time.

* * * * *